United States Patent [19]
Shimakura et al.

[11] Patent Number: 5,214,003
[45] Date of Patent: May 25, 1993

[54] PROCESS FOR PRODUCING A UNIFORM OXIDE LAYER ON A COMPOUND SEMICONDUCTOR SUBSTRATE

[75] Inventors: Haruhito Shimakura; Osamu Oda; Keiji Kainosho, all of Toda, Japan

[73] Assignee: Nippon Mining Co., Ltd., Tokyo, Japan

[21] Appl. No.: 640,429

[22] PCT Filed: May 29, 1990

[86] PCT No.: PCT/JP90/00690
§ 371 Date: Jan. 31, 1991
§ 102(e) Date: Jan. 31, 1991

[87] PCT Pub. No.: WO90/15436
PCT Pub. Date: Dec. 13, 1990

[30] Foreign Application Priority Data
May 31, 1989 [JP] Japan ................................ 1-140029
Feb. 14, 1990 [JP] Japan ................................ 2-33423

[51] Int. Cl.⁵ ...................... H01L 21/02; H01L 21/31
[52] U.S. Cl. .................................... 437/243; 437/946; 148/DIG. 65; 148/DIG. 118; 148/DIG. 119
[58] Field of Search ............... 437/243, 244, 945-946, 437/949; 148/DIG. 118, DIG. 119, DIG. 65

[56] References Cited
U.S. PATENT DOCUMENTS
4,172,906  10/1979  Pancholy ............... 148/DIG. 84

FOREIGN PATENT DOCUMENTS
57-058323  4/1982  Japan .
57-077093  5/1982  Japan .
58-139431  8/1983  Japan .
61-150340  7/1986  Japan .
02-239666  9/1990  Japan .
03-064073  3/1991  Japan .

Primary Examiner—John S. Maples
Attorney, Agent, or Firm—Foley & Lardner

[57] ABSTRACT

An inventive process for producing a semiconductor device has the steps of: putting a compound semiconductor substrate, an element of the substrate elements having a higher vapor pressure in a quartz ampoule, evacuating the ampoule, introducing oxygen gas into the ampoule and then sealing the ampoule; heating the ampoule to produce an oxide layer on the surface of the compound semiconductor substrate; and forming an electrode metal layer on the oxide layer to produce a MOS diode with a low interface trap density or a Schottky diode with a high barrier height and small ideal factor. Thus, the process produces a Schottky diode of a good forward current/voltage characteristic, low reverse current and superior rectification performance and a MESFET of a low dispersion at threshold voltage.

5 Claims, 3 Drawing Sheets

PROCESS FOR PRODUCING A UNIFORM OXIDE LAYER ON A COMPOUND SEMICONDUCTOR SUBSTRATE

DESCRIPTION

1. TECHNICAL FIELD

This invention relates to a process for producing field-effect transistors (hereinafter referred to as FET) fabricated on substrates made from compound semiconductor single crystals and especially to a technique most effective for a case in which a MOSFET (Metal Oxide Semiconductor FET), Schottky diode or MESFET (Metal Semiconductor FET) is formed on a substrate made of InP single crystal, a ternary or quaternary mixed crystal with InP.

2. BACKGROUND ART

Since a compound semiconductor such as GaAs or InP has an electron mobility higher than that of silicon, as well as a superior radiation resistance and a superior heat resistance, such compound semiconductors are prospectively expected for high-frequency and high-speed electronic devices instead of silicon, and a lot of research has been performed. However, since a stable oxide film of a low interface trap density has not been obtained, a MOSFET with substrates of GaAs or InP single crystal has not yet been obtained. Thus, MESFETs with Schottky electrode, discrete high-frequency FETs and small-scale digital ICs (i.e., semiconductor integrated circuit) have in practice been devices with GaAs single crystal. However, a GaAs MESFET entails a drawback in that, since a Schottky barrier height therein is low, a logic amplitude cannot be high when an IC is made of the GaAs MESFET, and large-scale digital ICs cannot be produced at a high yield.

On the other hand, it has been held that only a MESFET having a Schottky barrier height lower than GaAs could be made as a device with a substrate made of InP single crystal. Thus, attempts have been made to produce a MOSFET in which a metal layer (i.e., electrode) is formed on an oxide layer deposited on an InP substrate by thermal oxidation, anodic oxidation or plasma oxidation method. However, all of these methods result in a nonuniform composition of the oxide layer, so that insulation performance of the layer is poor. Hence, a good MOSFET has not been achieved in practice. Instead of such methods of producing MOSFETs, many processes for producing a MISFET (Metal Insulator Semiconductor FET) have been studied, such as low temperature deposition of an insulating layer of $SiO_2$, $SiN_x$, $Al_2O_3$ or PN on an InP substrate by CVD (Chemical Vapor Deposition), plasma CVD, light excitation CVD, sputtering, vapor deposition or spin-on method and forming of a metal layer on the insulating layer.

However, all of the MISFETs produced by the above methods are not used in practice, because they entail a fatal drawback in the electronic device in that a drain current drifts.

As described above, a MOSFET made from a compound semiconductor has not been practiced, because the composition of the oxide layer is nonuniform. It has been known, e.g., that thermally oxidizing InP in oxygen, first grows an about 20 Å thick $InPO_4$ layer and then deposits an $In_2O_3$ layer outside the $InPO_4$ layer and separates P (phosphorus) in an interface between InP and $InPO_4$, because the diffusion rate of P is lower than that of In (Indium). Such a phenomenon takes place when any of the anodic oxidation and plasma oxidation methods are used, which results in a failure to obtain a uniform and good oxide layer.

Thus, since thermal oxidation makes it difficult to produce a good insulating layer, the various low temperature deposition methods described above have been studied. However, the deposition methods have a problem in that, since they deposit a material from a different family atop a compound semiconductor substrate, a lattice mismatching takes place in the interface between an insulating layer and the compound semiconductor substrate. Therefore, a surface defect, dirt etc . . . , readily produces many interface traps resulting in a drifting of the drain current.

On the other hand, an attempt of placing an approximately 30 Å thick thin insulating layer (made, e.g., of $Al_2O_3$, $SiO_2$ or the like) between the InP substrate and the gate electrode metal has been made, in order to improve the barrier height of a Schottky diode with an electrode formed on the surface of the InP substrate.

Despite the above different attempts, in accordance with a prior-art Schottky electrode configuration on the InP, only a configuration having a 0.5 eV or less barrier height $\phi_B$, computed from a saturation current $I_s$, or a configuration having a high reverse current has been obtained. A constant n called an ideal factor reflects the integrity of a Schottky barrier in the following equation representing a forward current/voltage characteristic (I/V characteristic):

$$I = I_s \left[ \exp \frac{qV}{nkT} - 1 \right] \qquad (1)$$

where n was as high as 1.5-2.0 in the previous attempts. In the above equation, q represents an amount of charge, k represents Bolzmann's constant and T represents an absolute temperature. In addition, a saturation current $I_s$ is represented by the following equation:

$$I_s = AT^2 \exp \frac{-q\phi_B}{kT} . \qquad (2)$$

In equation (2), A represents the Richardson constant.

An object of this invention is to provide a technique of producing a MOSFET with a stable oxide layer of a low interface trap density and uniform characteristic from an InP type compound semiconductor substrate.

Another object of this invention is to provide a process for producing a Schottky diode and a MESFET with a Schottky gate electrode with a high barrier height and a good forward current/voltage characteristic.

DISCLOSURE OF THE INVENTION

In a MOSFET formed on a silicon substrate, an Si/$SiO_2$ interface is not the surface of an original silicon substrate in forming an oxide layer ($SiO_2$). This is because that oxygen diffuses in the oxide layer and reacts to the silicon of the substrate as oxidation proceeds, and therefore, an interface is formed inside the original crystal. Thus, the silicon substrate can achieve a low interface trap density which will not be affected by a defect present on or inside in the surface of the substrate, so that a MOSFET with a silicon substrate has been realized.

A general inspection of the above points leads to the conclusion that it would be best if a thermal oxidation layer provided an insulating layer in order to achieve an FET made of a compound semiconductor.

For an InP-MOS device with InP substrate and with an insulating layer made with a thermal oxidation layer, some prior-art methods have been discussed such as a thermal oxidation in oxygen, thermal oxidation in a high-pressure oxygen, thermal oxidation in $P_2O_5$, oxidation in a $HNO_3$ solution and a process of vapor depositing $P_2O_5$ and then heating and oxidizing the resulting deposition. However, all of these methods are insufficient and the InP MOSFET has not been realized. It was supposed as a reason therefore that the composition of an oxide layer formed on the crystal surface is nonuniform and an oxide with a poor insulating performance is produced, in part in the layer, since electrically conductive $In_2O_3$ and hydroscopic $P_2O_3$ are produced in an oxide layer production process.

Therefore, this invention proposes that a compound semiconductor substrate, an element of the substrate elements having a higher vapor pressure and oxygen gas, are put in a quartz ampoule, then the ampoule is sealed and then heated to form an oxide layer on the surface of the compound semiconductor substrate, and then a metal layer is formed as an electrode on the oxide layer.

In this invention, when the substrate is made, e.g., of InP, P (i.e., phosphorus) and $O_2$ (i.e., oxygen) are previously put into the ampoule, so that a supply of phosphorus from the phosphorus vapor to a crystal surface prevents the surface of the oxide layer from having a phosphorus deficit. A uniform oxide layer grows and an original surface of the substrate is taken in the oxide layer as the oxide layer grows, so that an oxide layer of a low interface trap density is produced.

Volumes of charged phosphorus and oxygen are controlled so that the phosphorus ($P_4$) vapor pressure left by the reaction represented by the following formula (3) is near the equilibrium vapor pressure of a stoichiometric InP at its oxide layer producing temperature:

$$P + O_2 \rightarrow P_2O_5 + P_4 \tag{3}$$

In addition, since P and $O_2$ are not put in the form of $P_2O_5$ (solid) into the ampoule but are separately put therein, controlling the phosphorus vapor pressure is easy and no water is brought into the ampoule, which produces a stable and uniform thermal oxide layer.

In addition, when the thickness of a produced oxide layer is 100 Å or less, electrons pass through the oxide layer by a tunneling effect when a voltage is applied to the electrode, so that a Schottky electrode of a high barrier height and small ideal factor is obtained. Thus, a Schottky diode with a good forward current/voltage characteristic, low reverse current and superior rectification and a MESFET of a low dispresion in threshold voltage can be obtained.

DETAILED DESCRIPTION OF THE PREFERRED EMBODIMENTS

Embodiment 1

An undoped n-type InP single crystal with a 2-inch diameter was grown by the LEC method (i.e., liquid encapsulated Czochralski method). The resulting built up crystal was cut transverse to a pulling rod. The cutout wafer was washed with an organic solvent, then etched with bromomethanol and then washed with HF (i.e., hydrofluoric acid) immediately before oxidation. The carrier density of the wafer was $(4-6) \times 10^{15}$ cm$^{-3}$.

Then, a solid P including phosphorus (i.e., red phosphorus) and an undoped InP wafer were placed in a quartz ampoule. Then, the interior of the ampoule was evacuated, and oxygen gas of 0.1-0.3 atm at a room temperature was brought into the ampoule. The ampoule was then sealed. A volume of phosphorus was determined a volume of a 0.2-2.0 atm pressure at heating.

The quartz ampoule containing the wafer was heated at 450°-700° C. for 5-20 hr to form an oxide layer on the wafer.

A photoresist was applied to one surface of the wafer with the oxide layer. A lapping and a bromomethanol etchant eliminated an oxide layer from the other surface of the wafer and then an AuGe layer was vapor deposited on the other surface in order to produce an ohmic electrode. Then, the above photoresist was eliminated and the wafer was annealed in $N_2$-gas at 350° C. for 5 min to produce the ohmic electrode made of AuGe on the surface from which oxide layer was eliminated. In addition, Al (aluminum) electrodes with 0.3 mm diameter were vapor deposited with 1 mm spacings on the surface of the wafer with the oxide layer remaining by means of a metal mask. MOS capacitors were produced.

Figure 1:
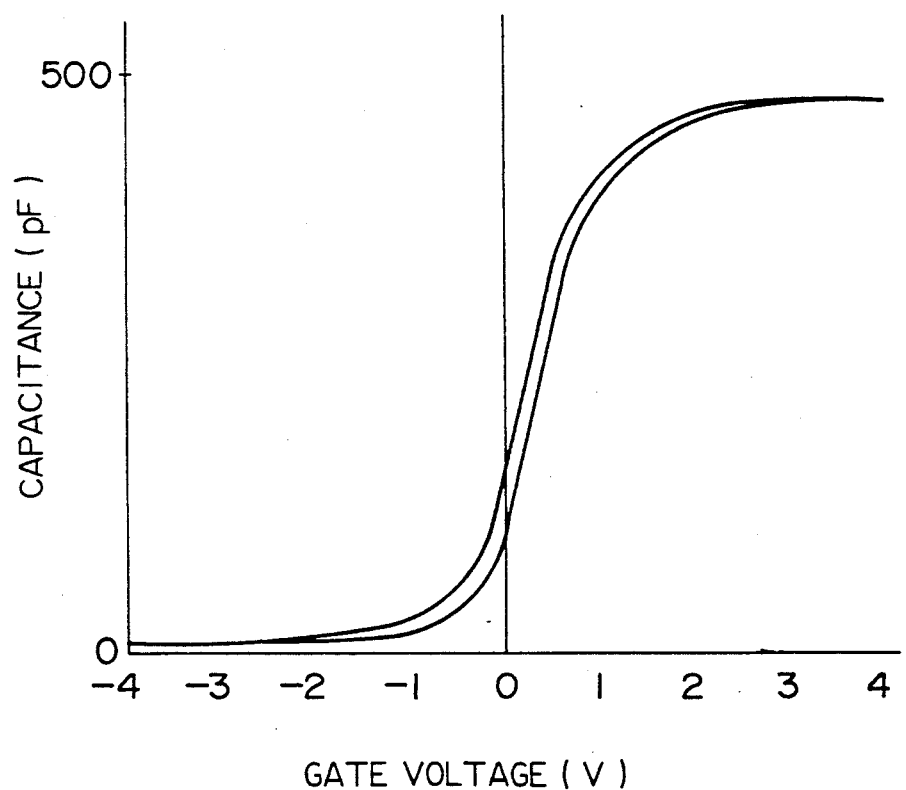
FIG. 1 is a graph of a capacitance to voltage characteristic of a MOS capacitor of a first embodiment of this invention.

FIG. 1 represents a C/V characteristic measured on the produced MOS capacitor.

In a prior-art method, an amount of shift of the C/V characteristic caused in the voltage axis was 2 V or more. On the other hand, the present embodiment produced a superior insulating layer with a 0.25 V or less amount of shift of a hysteresis caused in the voltage axis, as apparent from FIG. 1. This demonstrates that the method of this invention is very effective in reducing a drain current drift in a MOSFET with InP semiconductor substrate. An interface trap density measured by Turman method was $1 \times 10^{11}$ cm$^{-2}$ eV$^{-1}$ or less. This invention provided a good insulating layer with a low interface trap density.

Embodiment 2

An undoped InP single crystal with a 2-inch diameter was grown using the LEC method. The crystal was cut transverse to a pulling rod. The cutout wafer was polished to be 350 μm thick and then etched with bromomethanol.

The undoped InP wafer was then placed in a quartz ampoule together with red phosphorus. The interior of the ampoule was evacuated to be at $10^{-4}$ Torr. Then, oxygen gas was brought into the ampoule, which was sealed by a burner. The volume of the red phosphorus was previously determined so that the vapor pressure thereof was 0.5 atm at a heat treatment temperature. The volume of the oxygen was previously determined so that the pressure thereof was 1.0 atm at the heat treatment temperature. Thus, the red phosphorus and oxygen were charged.

The quartz ampoules containing the wafer were heated at different temperatures in the range of 250°-500° C. for 1 hr so that an oxide layer was formed on the wafer.

Then, the wafers were taken out of each ampoule. A photoresist was applied to one surface with the oxide layer of each wafer. The oxide layer was eliminated from the other surface of the wafer by etching. Then; an AuGe layer was vapor deposited on the etched surface. Then, the wafers were heat treated in nitrogen gas at 350° C. for 10 min to have an ohmic electrode. Then, the photoresist was eliminated. Then, an aluminum layer was vapor deposited on the surface with the oxide layer remaining of each wafer by means of a metal mask so that 0.32 mm×0.32 mm Al Schottky electrodes were produced with 0.3 mm spacings.

Figure 2:
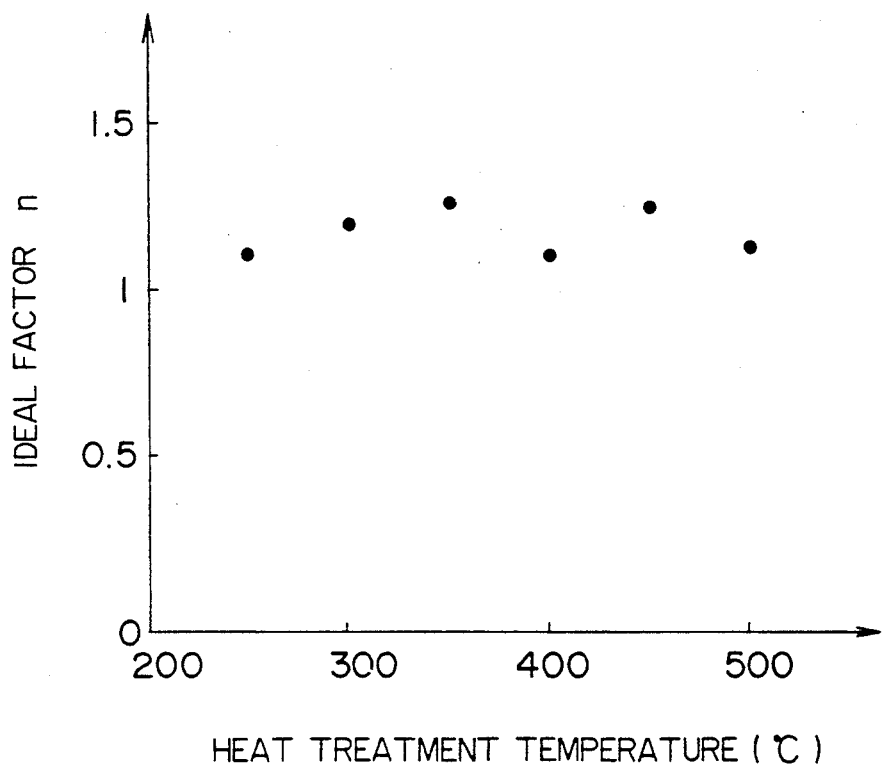
FIG. 2(A) is a graph of a relationship between a heat treatment temperature and ideal factor of a MESFET of a second embodiment of this invention.
FIG. 2(B) is a graph of a relationship between a heat treatment temperature and barrier height of the MESFET of the second embodiment of this invention.
Figure 2:
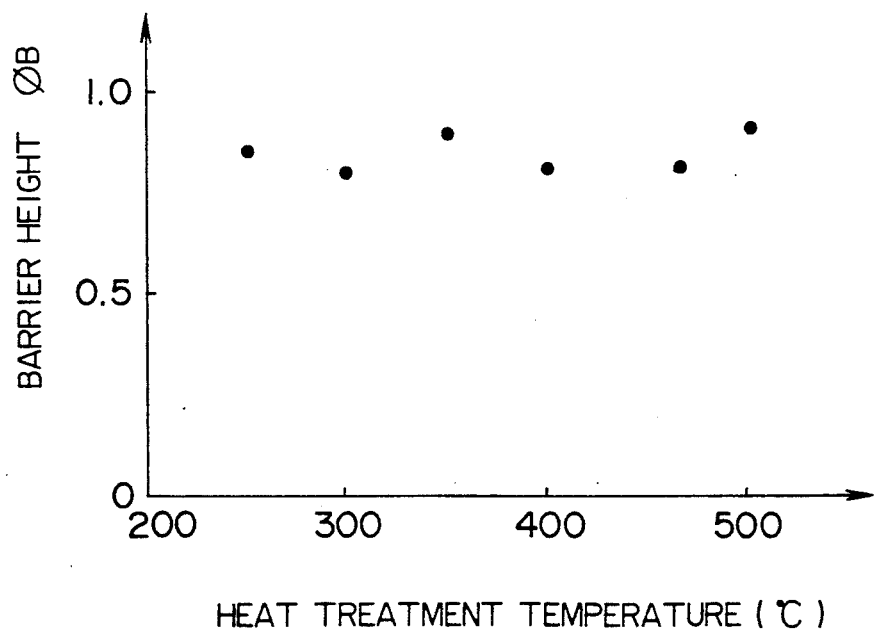

The ideal factor n and barrier height $\phi_B$ of a diode were computed from the forward current/voltage characteristic of quasi-MIS type Schottky electrodes thus produced. This resulted in Schottky diodes with the superior characteristic of a 1.1-1.3 ideal factor n and 0.8-0.9 barrier height $\phi_B$, as seen in FIGS. 2(A) and 2(B).

Embodiment 3

An Fe-doped semi-insulating InP single crystal with a 2-inch diameter was grown using the LEC method. The crystal was cut transverse to a pulling rod. The cutout wafer was polished to have a 450 μm thickness. The wafer was washed with an organic solvent and then etched with bromomethanol so that an affected layer and dirt were eliminated. Then, $Si^+$ ion with a 29 mass number were implanted in the one surface of the wafer at 100 keV acceleration voltage with a $4\times10^{12}$ $cm^{-2}$ dose.

After the ion implantation, a 1,500 Å thick $SiN_x$ layer was deposited on the both sides of the wafer by sputtering. Then, an infrared heating furnace was used for activation annealing the resulting wafer at 620° C. for 15 min. After the activation annealing, an etching of the $SiN_x$ layer with hydrofluoric acid eliminated this layer. Then, mesa-etching an activation layer of the wafer surface other than those portions providing pads to a source, drain and a channel area with hydrochloric-acid etchant eliminated it and separated devices. Then, the resulting wafer surface was covered with a photoresist, exposed to light and patterned. An AuGe/Ni/Au layer was vapor deposited on the resulting wafer. Then, metal layers were left on the pads of the source and drain by a lift-off method. The resulting wafer was heat treated at 350° C. for 3 min thereby producing ohmic electrodes.

The wafer as thus treated was placed in a quartz ampoule together with red phosphorus. The interior of the ampoule was evacuated to be at $10^{-6}$ Torr. Then, oxygen gas was brought into and charged in the ampoule. In this case, the volume of the red phosphorus was determined so that the vapor pressure thereof was 0.5 atm at the heating temperature and the volume of oxygen was determined so that the pressure thereof was 1.0 atm at the heating temperature. Thus, the red phosphorus and oxygen were charged. Then, the quartz ampoule containing the wafer was heat treated at 350° C. for 1 hr thereby producing a gate insulating layer on the surface of the channel area. Concurrently, oxide layers were also produced on parts of the wafer surface from the side surfaces of a residual active layer and surrounding areas.

Finally, an aluminum layer was vapor deposited and patterned on the wafer surface by a lift-off method to provide a gate electrode.

Figure 3:
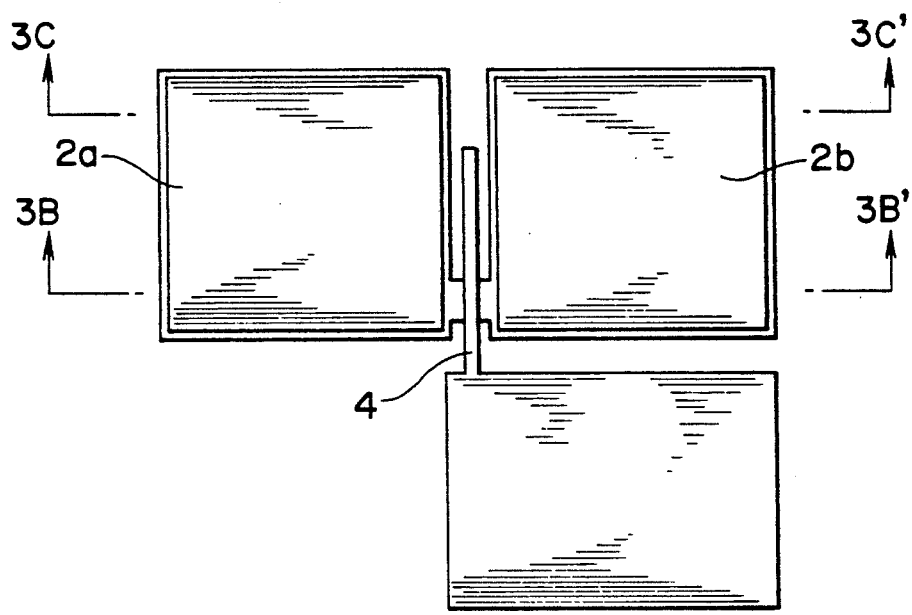
FIG. 3(A) is a plan view of one example of a MESFET of a third embodiment of this invention.
FIG. 3(B) is a section taken along line 3B—3B' in FIG. 3(A)
FIG. 3(C) is a section taken along line 3C—3C' in FIG. 3(A)
Figure 3:
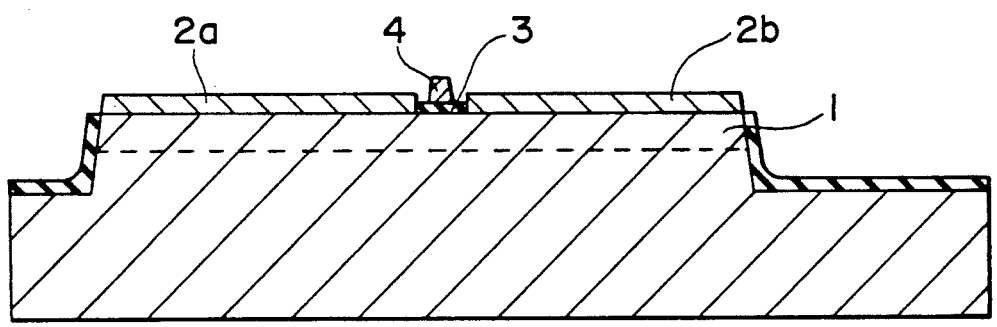
Figure 3:
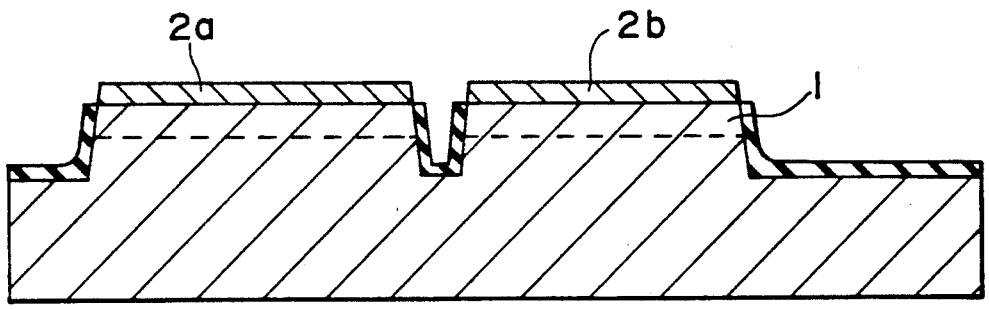

FIGS. 3(A) to 3(C) illustrate a configuration of the MESFET of the present embodiment. In FIGS. 3(A) to 3(C), an active layer is indicated at 1, ohmic electrodes are indicated at 2a and 2b, a gate insulating layer is indicated at 3, and a gate electrode is indicated at 4. The gate electrode length of the produced MESFET was 2 μm. The gate width thereof was 10 μm. A spacing between the source and drain electrodes thereof was 6 μm. A spacing between each FET was 200 μm.

The threshold voltage $V_{th}$ of the MESFET as thus produced was measured in the range of saturation along the centerline of the wafer. Table 1 represents the results of the measurement.

TABLE 1

| $V_{th}$ (V) | Frequency (Number) |
|---|---|
| −0.83 | 1 |
| −0.82 | 6 |
| −0.81 | 22 |
| −0.80 | 63 |
| −0.79 | 18 |
| −0.78 | 4 |
| −0.77 | 2 |

As apparent from Table 1, an average of threshold voltages $V_{th}$ is −0.8 V and a dispersion $\sigma V_{th}$ is 9.6 mV.

As described above, since in accordance with this invention, the compound semiconductor substrate, the elements of the substrate having a higher vapor pressure and oxygen gas, are put in the quartz ampoule, which is then sealed. The compound semiconductor substrate is thermally oxidized to produce the oxide layer on the surface thereof and then electrode metal layers are formed on the layer. A supply of phosphorus from phosphorus vapor to the crystal surface prevents the surface of the oxide layer from a phosphorus deficit, since, in the case of InP, the ampoule previously contains the phosphorus and oxygen. Thus, a uniform oxide layer grows, and an original substrate surface is taken into the oxide layer as the oxide layer grows to provide an oxide layer of a low interface trap density. In addition, since phosphorus and oxygen are not put in the form of $P_2O_5$ (solid) into the ampoule, but P and $O_2$ are separately put therein, controlling the vapor pressure of P is easy and no water is brought into the ampoule. Thus, a stable and uniform thermal oxidation layer is produced.

In addition, when the thickness of the produced oxide layer is 100 Å or less, electrons pass through the oxide layer by a tunnelling effect, so that a Schottky electrode of a high barrier height and a small ideal factor are obtained. Thus, a Schottky diode of a good forward current/voltage characteristic, low reverse current and superior rectification performance and a MESFET of a low dispersion in threshold voltage are obtained.

INDUSTRIAL APPLICABILITY

The above embodiments have described the cases in which the MOSFET, Schottky diode and MESFET are formed on the InP single crystal substrate. This invention is also applicable to cases in which MOSFETs are formed on an In- and P-including ternary or quaternary mixed crystal substrate and in addition, MOSFETs, Schottky diodes and MESFETs are formed on substrates made of other compound semiconductors such as GaAs, so that this invention produces essentially the same advantage.

We claim:

1. A process for producing a uniform oxide layer on a compound semiconductor substrate, comprising the following steps in order:

placing a compound semiconductor substrate comprising two elements, one of said elements having a higher vapor pressure than the other element, into a quartz ampoule with the element of the compound semiconductor substrate having the higher vapor pressure, evacuating the interior of the ampoule, introducing oxygen gas into the ampoule, sealing the ampoule, and heating the ampoule to produce a uniform oxide layer on the compound semiconductor substrate.

2. A process for producing a compound semiconductor substrate as claimed in claim 1, wherein the semiconductor substrate is an InP single crystal substrate and the element of the compound semiconductor substrate that is placed in the ampoule is red phosphorus.

3. A process for producing a compound semiconductor device, comprising the following steps in order:

placing a compound semiconductor substrate comprising two elements, one of said elements having a higher vapor pressure than the other element, into an ampoule with an element of the compound semiconductor substrate, the element of the compound semiconductor substrate that is placed in the ampoule being the element having the higher vapor pressure;

evacuating the interior of the ampoule;

introducing oxygen gas into the ampoule;

sealing the ampoule;

heating the ampoule to produce a uniform oxide layer on the compound semiconductor substrate; and depositing a metal layer over said uniform oxide layer.

4. A process for producing a compound semiconductor device as claimed in claim 3, wherein the compound semiconductor substrate comprises InP and the element of the compound semiconductor substrate that is placed in the ampoule is phosphorus.

5. A process for producing a uniform oxide layer on a compound semiconductor substrate as claimed in claim 4, wherein the phosphorus is red phosphorus.

* * * * *